(12) United States Patent
Kim et al.

(10) Patent No.: US 8,222,110 B2
(45) Date of Patent: Jul. 17, 2012

(54) METHOD FOR FABRICATING SEMICONDUCTOR DEVICE WITH VERTICAL TRANSISTOR HAVING A SECOND ACTIVE PILLAR FORMED OVER A FIRST ACTIVE PILLAR

(75) Inventors: Eun-Jeong Kim, Gyeonggi-do (KR); Sang-Tae Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 20 days.

(21) Appl. No.: 12/827,234

(22) Filed: Jun. 30, 2010

(65) Prior Publication Data

US 2011/0003447 A1   Jan. 6, 2011

(30) Foreign Application Priority Data

Jul. 3, 2009   (KR) .................. 10-2009-0060878

(51) Int. Cl.
*H01L 21/336* (2006.01)
(52) U.S. Cl. ........ 438/270; 438/156; 438/173; 438/192; 438/206; 438/212; 257/330; 257/331; 257/332; 257/302
(58) Field of Classification Search .................. 257/135, 257/136, 242, 329, 330, 331, 332, 302, 328; 438/136, 137, 156, 173, 192, 206, 212, 268, 438/269, 270, 692
See application file for complete search history.

(56) References Cited

U.S. PATENT DOCUMENTS

| | | | |
|---|---|---|---|
| 2005/0145952 A1* | 7/2005 | Gonzalez et al. | 257/374 |
| 2005/0181564 A1* | 8/2005 | Hshieh et al. | 438/270 |
| 2010/0237405 A1* | 9/2010 | Shin | 257/329 |

FOREIGN PATENT DOCUMENTS

| | | |
|---|---|---|
| KR | 100869353 | 11/2008 |
| KR | 1020090067511 | 6/2009 |
| KR | 1020090067594 | 6/2009 |

OTHER PUBLICATIONS

Notice of Allowance issued from Korean Intellectual Property Office on Nov. 30, 2011.

* cited by examiner

*Primary Examiner* — Ha Tran T Nguyen
*Assistant Examiner* — Thanh Y Tran
(74) *Attorney, Agent, or Firm* — IP & T Group LLP

(57) ABSTRACT

A method for fabricating a semiconductor device includes forming a plurality of first active pillars by etching a substrate using a hard mask layer as an etching barrier, forming a gate conductive layer surrounding sidewalls of the first active pillars and the hard mask layer, forming a word line conductive layer filling gaps defined by the gate conductive layer, forming word lines and vertical gates by simultaneously removing portions of the word line conductive layer and the gate conductive layer on the sidewalls of the hard mask layer, forming an inter-layer dielectric layer filling gaps formed by removing the word line conductive layer and the gate conductive layer, exposing surfaces of the first active pillars by removing the hard mask layer, and growing second active pillars over the first active pillars.

15 Claims, 8 Drawing Sheets

METHOD FOR FABRICATING SEMICONDUCTOR DEVICE WITH VERTICAL TRANSISTOR HAVING A SECOND ACTIVE PILLAR FORMED OVER A FIRST ACTIVE PILLAR

CROSS-REFERENCE TO RELATED APPLICATIONS

The present application claims priority of Korean Patent Application No. 10-2009-0060878, filed on Jul. 3, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with a vertical transistor.

In a sub-60-nm DRAM fabrication process, the formation of vertical transistors is desirable to increase the degree of integration of transistors in cells, simplify the fabrication processes, and improve device characteristics. A vertical transistor includes an active pillar and a vertical gate surrounding the active pillar. Due to the vertical gate, a channel of the transistor is formed in a vertical direction.

In general, an active pillar has a structure of a neck pillar and a top pillar, and a gate surrounds the neck pillar. However, the neck pillar usually has a weak supporting force, so that the active pillar easily collapses in the following process.

In an attempt to address the above-discussed concerns of the neck pillar structure, an active pillar without the structure of the neck pillar, i.e. a neck-free active pillar, has been developed.

FIGS. 1A to 1D illustrate a conventional method for fabricating a semiconductor device including vertical transistors.

Referring to FIG. 1A, a substrate 11 is etched using a hard mask layer 13, in which a hard mask oxide layer 13A and a hard mask nitride layer 13B are stacked, as an etching barrier to form neck-free active pillars 12.

Buried bit lines (BBL) 14 are formed by implanting impurity ions into the substrate 11 between the active pillars 12.

A gate dielectric layer 15 is formed, and a gate conductive layer 16 is formed along the profile/surface of a resulting structure including the gate dielectric layer 15. The gate conductive layer 16 is etched so that spacers remain to surround sidewalls of the active pillars 12.

Referring to FIG. 1B, a first separation layer 17 is formed over a resulting structure, and trenches 18 are formed to separate the buried bit lines 14.

Referring to FIG. 1C, a second separation layer 19 is formed to fill the gaps, i.e., the trench 18, and the height of the second separation layer 19 is lowered through an etch-back process. Since a gate length is determined by the length of the second separation layer 19 removed by the etch-back process, it is desirable to etch the second separation layer 19 uniformly. Unless the second separation layer 19 is removed from the upper sidewalls of the active pillars 12, the gate conductive layer 16 formed on the upper portions of the active pillars 12 is not etched properly. Therefore, a subsequent cleaning process is performed to cleanly remove at least the second separation layer 19 formed on the upper sidewalls of the active pillars 12.

Referring to FIG. 1D, portions of the gate conductive layer 16 formed on the upper sidewalls of the active pillars 12 are removed to form vertical gates 16A.

Word lines 20 may be formed to connect the adjacent vertical gates 16A to each other.

As described above, the conventional method requires a process of removing portions of the gate conductive layer 16, which are formed on the upper sidewalls of the active pillars 12, in order to form the gate electrodes 16A.

However, since the height of the active pillars 12 is 2,000 Å or more, in accordance with the trend towards a high degree of integration, it is difficult to completely remove portions of the gate conductive layer 16 from the upper sidewalls of the active pillars 12. Thus, a tail shaped portion of the gate conductive layer 16, as indicated by reference symbol "A", may remain.

Furthermore, the second separation layer 19 may be excessively lost during the cleaning process subsequent to the etch-back process.

SUMMARY OF THE INVENTION

Exemplary embodiments of the present invention are directed to a method for fabricating a semiconductor device, which is capable of removing a gate conductive layer from upper sidewalls of active pillars.

In accordance with an embodiment of the present invention, a method for fabricating a semiconductor device includes forming a plurality of first active pillars by etching a substrate using a hard mask layer as an etching barrier, forming a gate conductive layer surrounding sidewalls of the first active pillars and the hard mask layer, forming a word line conductive layer filling gaps defined by the gate conductive layer, forming word lines and vertical gates by simultaneously removing portions of the word line conductive layer and the gate conductive layer on the sidewalls of the hard mask layer, forming an inter-layer dielectric layer filling gaps formed by removing the word line conductive layer and the gate conductive layer, exposing surfaces of the first active pillars by removing the hard mask layer, and growing second active pillars over the first active pillars.

DESCRIPTION OF SPECIFIC EMBODIMENTS

Figure 1A:
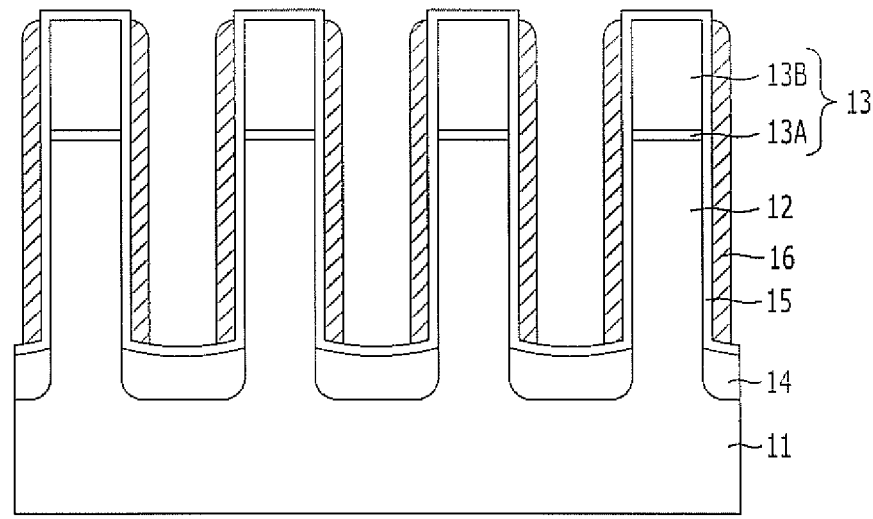
FIGS. 1A to 1D illustrate a conventional method for fabricating a semiconductor device including vertical transistors.
Figure 1B:
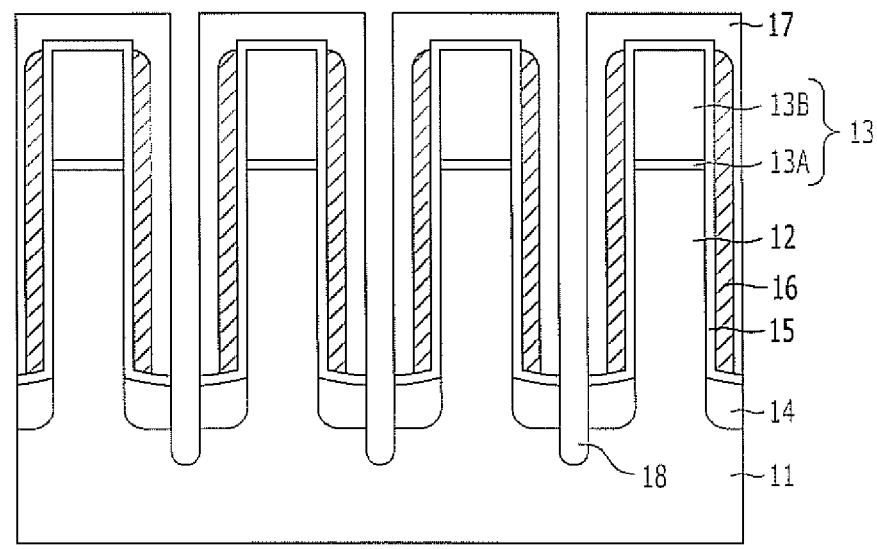
Figure 1C:
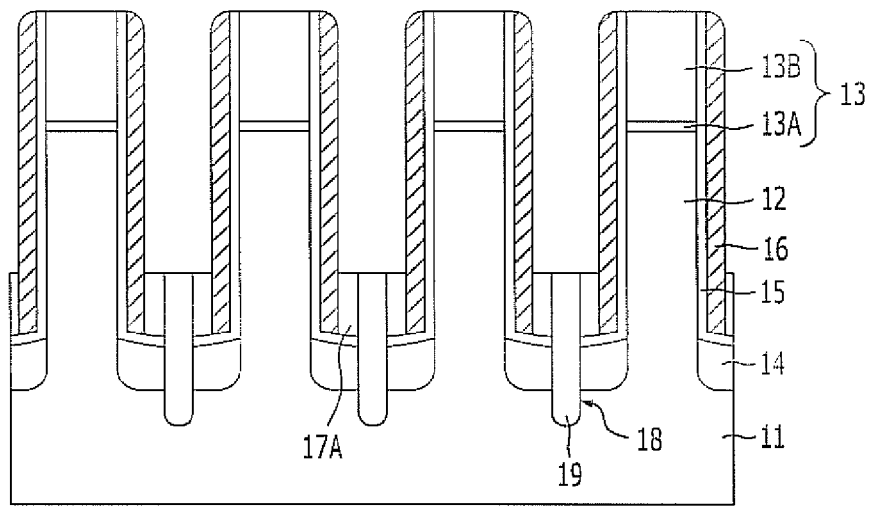
Figure 1D:
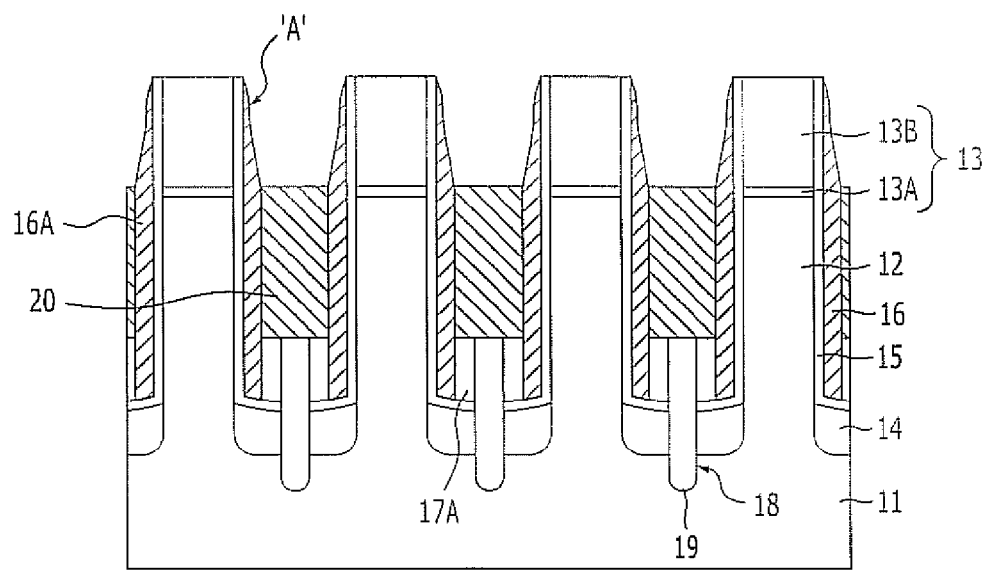

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2K are cross-sectional views illustrating a method for fabricating a semiconductor device in accordance with an exemplary embodiment of the present invention.

Figure 2A:
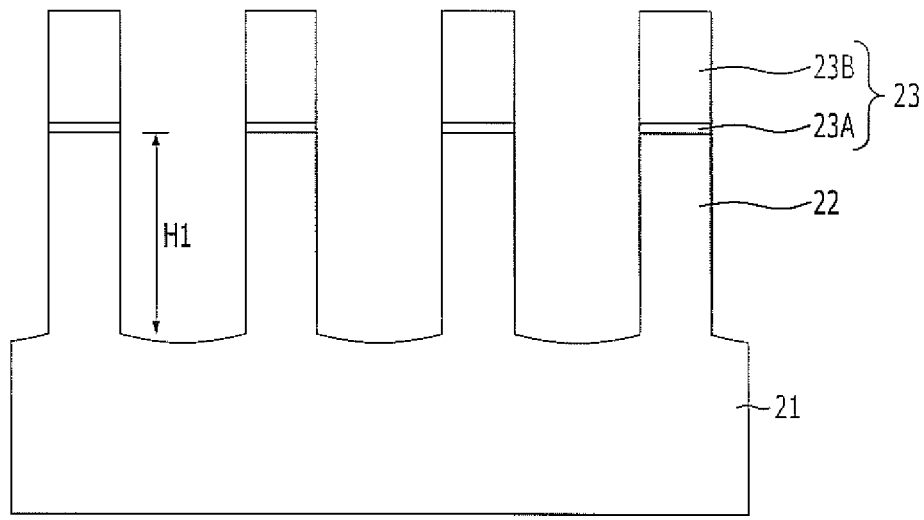
FIGS. 2A to 2K are cross-sectional views illustrating a method for fabricating a semiconductor device in accordance with an exemplary embodiment of the present invention.

Referring to FIG. 2A, first active pillars 22 are formed on a substrate 21.

The first active pillars 22 have a pillar structure in which pillars are arranged in a dot matrix form, and define active regions in which channels of transistors are to be formed. The first active pillars 22 have a neck-free structure (i.e., have a substantially straight profile) which extends vertically from the substrate. The neck-free structure is stable and robust against collapse. The first active pillars 22 have a height H1 of 1,300 Å or less. Otherwise, they could collapse in subsequent processes. As described later, second active pillars for source/drain regions are formed in a subsequent process. While a conventional fabricating method forms relatively tall active pillars in consideration of a channel region and a source region, a fabricating method in accordance with the embodiment of the present invention forms the first active pillars serving as a channel region, and then forms the second active pillars serving as a source/drain region in a subsequent process. Since the first active pillars 22 serving as a channel region are first formed, their height may be lower.

The first active pillars 22 are formed through an etching process using a hard mask layer (pad layer) 23. The first active pillars 22 may have a height ranging from approximately 800 Å to approximately 1,300 Å.

A silicon substrate may be used as the substrate 21. In this case, the etching process for forming the active pillars 22 may be performed by a dry etching process using $Cl_2$ gas or HBr gas solely, or a mixture of $Cl_2$ gas and HBr gas.

The hard mask layer 23 has a structure in which a hard mask oxide layer 23A and a hard mask nitride layer 23B are stacked. The hard mask oxide layer 23A has a thickness ranging from approximately 500 Å to approximately 700 Å, and the hard mask nitride layer 23B has a thickness ranging from approximately 1,000 Å to approximately 1,700 Å.

Figure 2B:
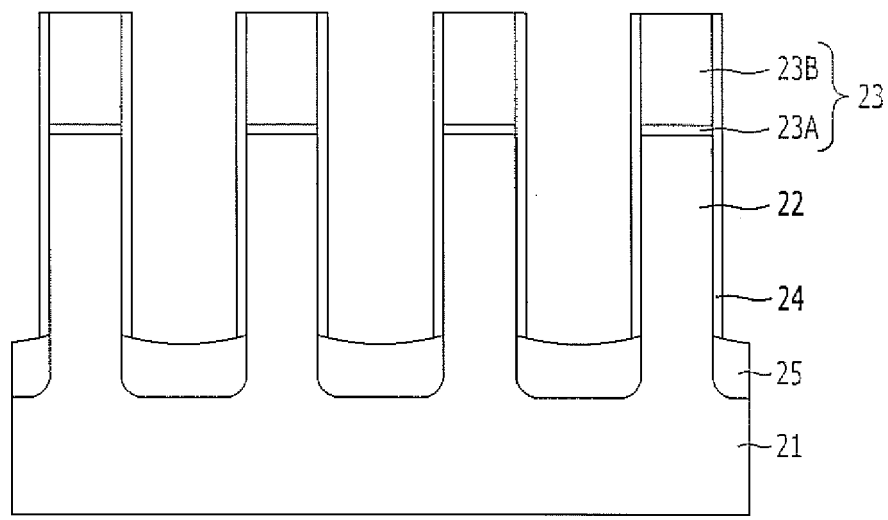

Referring to FIG. 2B, impurity ions are implanted into the substrate 21 between the first active pillars 22 to form buried bit lines 25. The buried bit lines 25 may be formed by implanting N-type impurity ions, such as phosphorus (P) and arsenic (As).

The buried bit lines 25 may be formed after annular vertical gates are formed. However, it is desirable to form the buried bit lines 25 immediately after the first active pillars 22 are formed, when the area for the formation can be easily accessed and a silicide process or the like can be performed to form buried bit lines having sufficiently low resistance.

The ion implantation process forming the buried bit lines 25 may be performed after the formation of a sacrificial spacer 24 covering sidewalls of the first active pillars 22 and the hard mask layer 23. The sacrificial spacer 24 is formed by depositing an oxide layer and performing a spacer-etching process thereon. The sacrificial spacer 24 can prevent impurity ions from being implanted into the sidewalls of the first active pillars 22 during the ion implantation process. The sacrificial spacer 24 has a thickness ranging from approximately 50 Å to approximately 300 Å. The sacrificial spacer 24 is removed after the ion implantation process.

As described above, a silicide process may be performed in order to lower the sheet resistance of the buried bit lines 25 after the buried bit lines 25 have been formed. For example, silicide may include titanium silicide, cobalt silicide, nickel silicide, or the like.

Figure 2C:
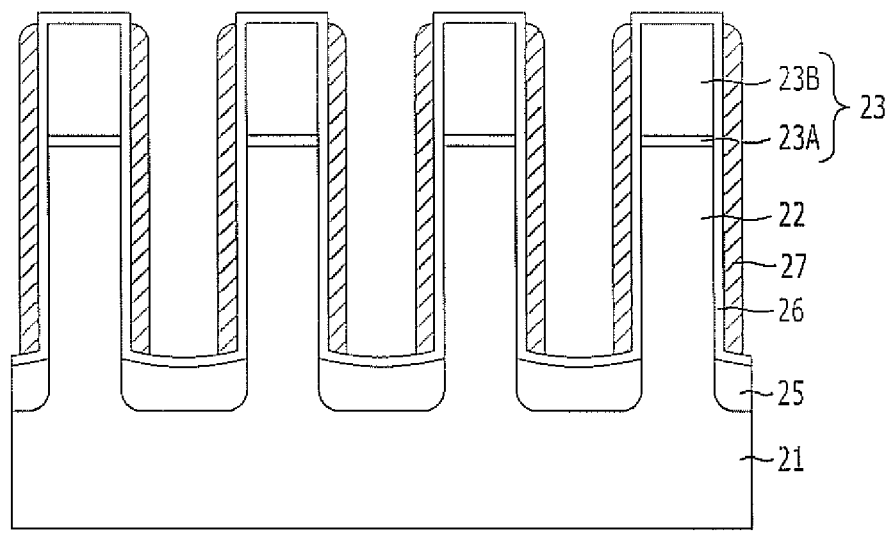

Referring to FIG. 2C, a gate dielectric layer 26 is formed. The gate dielectric layer 26 may be formed over a resulting structure by using a deposition process. Alternatively, the gate dielectric layer 26 may be formed by using a thermal oxidation process or a radical oxidation process. The gate dielectric layer 26 has a thickness ranging from approximately 30 Å to approximately 80 Å.

A gate conductive layer 27 is formed along the profile/surface of the resulting structure including the gate dielectric layer 26. Through an etch-back process, the gate conductive layer 27 surrounding the sidewalls of the first active pillars 22 and the hard mask layer 23 remains. Because the first active pillars 22 have a relatively small height, the gate conductive layer 27 can be conformally formed. The deposition thickness of the gate conductive layer 27 may be in a range from approximately 100 Å to approximately 200 Å. Specifically, the gate conductive layer 27 may include a metal nitride layer. For example, the gate conductive layer 27 includes a titanium nitride (TiN) layer or a tantalum nitride (TaN) layer. Alternatively, the gate conductive layer 27 may be formed by stacking a tantalum nitride (TaN) layer and a titanium nitride (TiN) layer. In this case, the tantalum nitride (TaN) layer may be formed to have a small thickness ranging from approximately 20 Å to approximately 60 Å and serves as a diffusion barrier. The gate conductive layer 27 may be deposited by a metal organic chemical vapor deposition (MOCVD) process or a metal organic atomic layer deposition (MOALD) process.

The gate conductive layer 27 is further etched in a subsequent process to form vertical gates surrounding the sidewalls of the first active pillars 22.

Figure 2D:
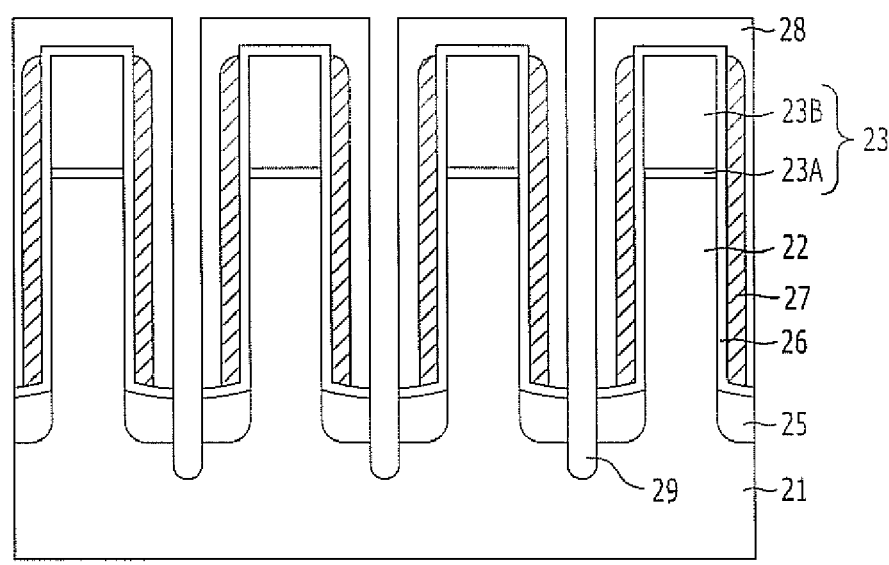

Referring to FIG. 2D, a first inter-layer dielectric layer 28 is formed over a resulting structure including the gate conductive layer 27. In this case, the first inter-layer dielectric layer 28 is formed over a resulting structure to fill the gaps between the first active pillars 22, and serves as a separation layers between adjacent first active pillars 22. The first inter-layer dielectric layer 28 may be formed of any type of oxide, such as HDP oxide, BPSG oxide, SOD oxide, TEOS oxide, USG oxide, ALD oxide, and so on. Specifically, Plowable oxide such as SOD or BPSG may be used. The first interlayer dielectric layer 28 has a thickness ranging from approximately 500 Å to approximately 6,000 Å.

A process of separating the buried bit lines 25 is performed. Specifically, the first inter-layer dielectric layer 28, the gate dielectric layer 26, and the substrate 21 are etched by a certain depth through a buried bit line mask process (not shown) to form trenches 29 which separate the buried bit lines 25 from one another. The trenches may have a thickness ranging from approximately 1,800 Å to approximately 2,200 Å.

Figure 2E:
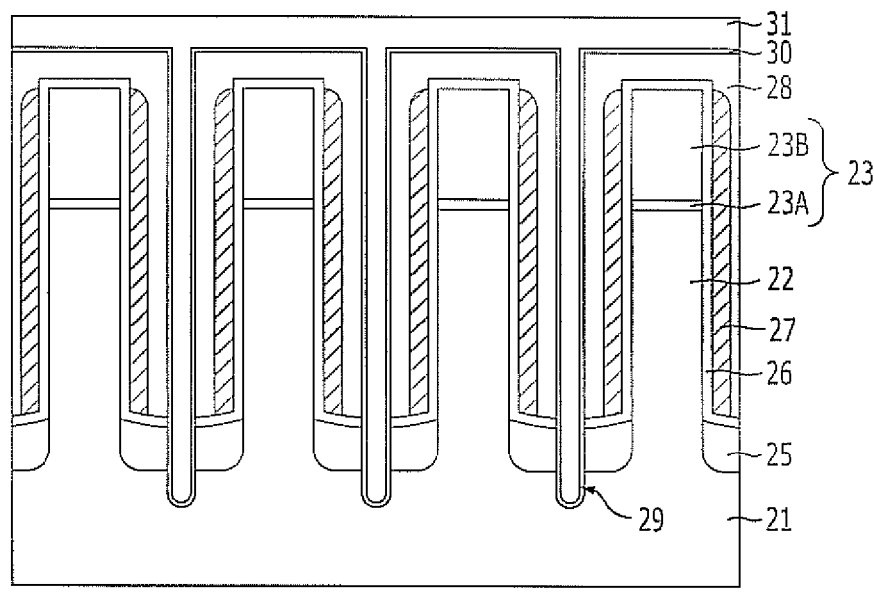

Referring to FIG. 2E, a second inter-layer dielectric layer 31 is formed to gap-fill the trenches 29. The second inter-layer dielectric layer 31 may include an oxide layer. For example, the second inter-layer dielectric layer 31 may be formed of any type of oxide, such as HDP oxide, BPSG oxide, SOD oxide, TEOS oxide, USG oxide, ALD oxide, and so on. Specifically, flowable oxide such as SOD or BPSG may be used. The second inter-layer dielectric layer 31 serves as a separation layer of the buried bit lines 25 and the first active pillars 22.

Prior to the formation of the second inter-layer dielectric layer 31, a liner layer 30 may be formed in order to increase adhesive force of the second inter-layer dielectric layer 31. The liner layer 30 may include an oxide layer, and it may be provided by forming low pressure CVD tetra ethyl ortho silicate (LPTEOS) with a thickness ranging from approximately 100 Å to approximately 400 Å.

Figure 2F:
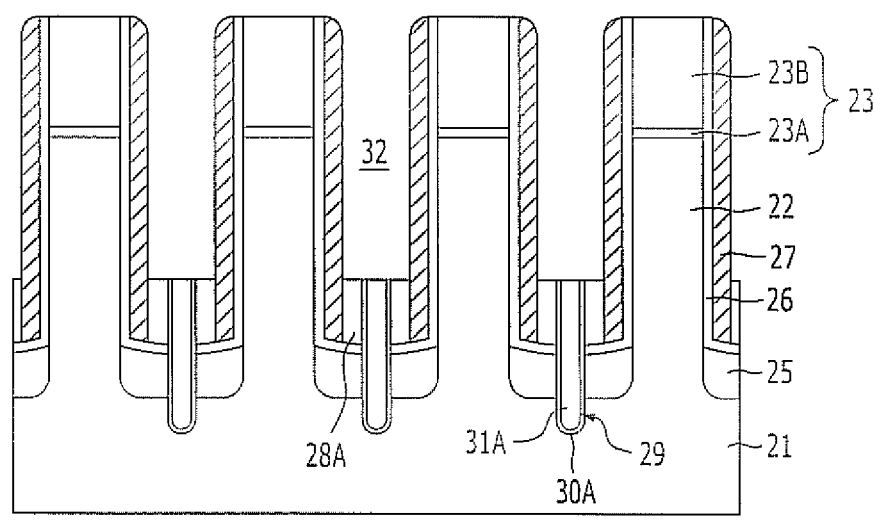

Referring to FIG. 2F, an etching process for forming damascene word lines is performed to form damascene patterns 32. First, a photoresist pattern (not shown) is formed in a direction intersecting with the buried bit lines 25. The second inter-layer dielectric layer 31, the liner layer 30, and the first inter-layer dielectric layer 28, which fill the gaps defined by the gate conductive layer 27, are partially removed through a dry etching process. The second inter-layer dielectric layer 31 and the first inter-layer dielectric layer 28, which may remain on the upper sides of the gate conductive layer 27, are removed through a wet etching process. Such removal of the inter-layer dielectric layers from the upper sides of the gate conductive layer 27 guarantees direct contact between word lines and vertical gates in a subsequent process, thereby obtaining word lines with a low resistance.

As a result, after the damascene patterns 32 are formed, the height of the first and second inter-layer dielectric layers 28A and 31A decreases, and the liner layer 30A remains between the first and second inter-layer dielectric layers 28A and 31A.

Figure 2G:
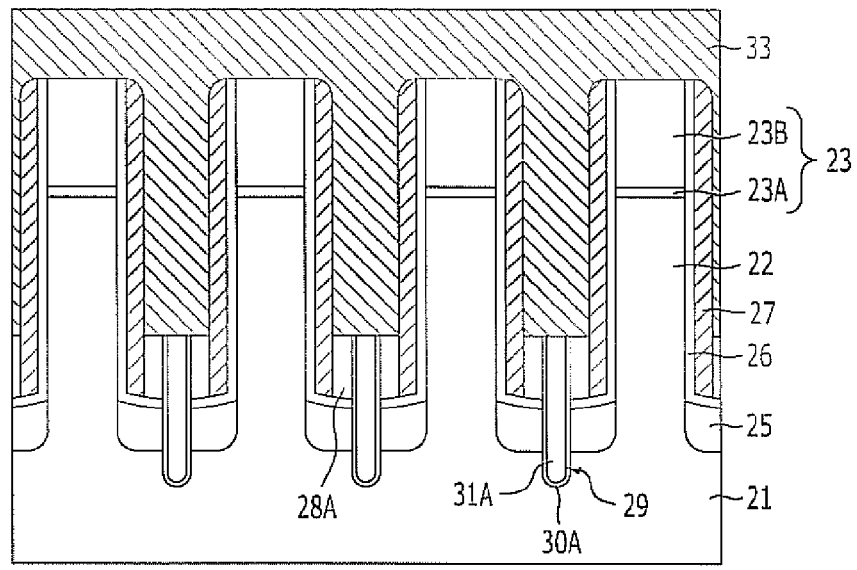

Referring to FIG. 2G, a word line conductive layer 33 is is deposited over a resulting structure to fill the damascene patterns 32.

The word line conductive layer 33 may include a titanium nitride layer or a tungsten layer. Alternatively, the word line conductive layer 33 may be formed by stacking a titanium nitride layer and a tungsten layer. In this case, the titanium nitride layer may have a thickness ranging from approximately 80 Å to approximately 150 Å.

Figure 2H:
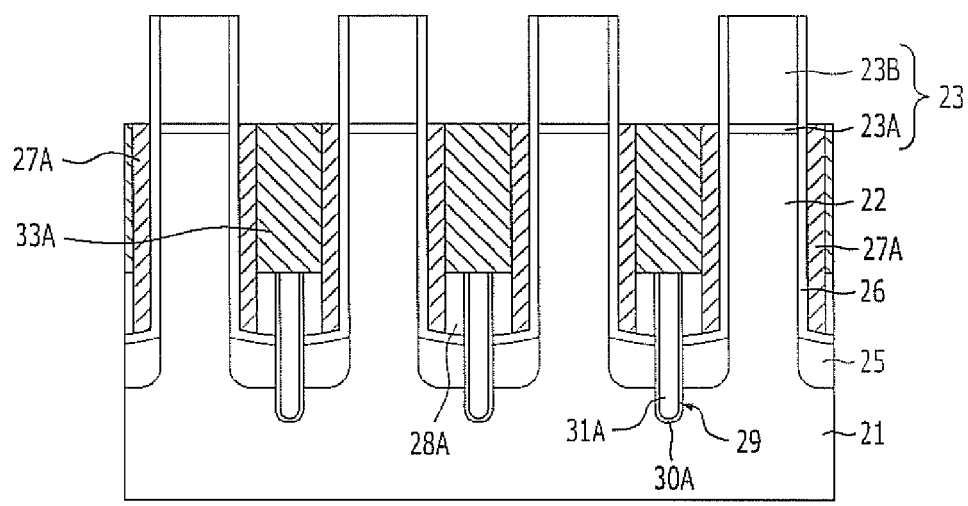

Referring to FIG. 2H, word lines are formed through a process of separating the word line conductive layer 33. As a result, word lines 33A buried inside the damascene patterns 32 are formed.

The process of separating the word line conductive layer 33 is performed by sequentially performing a chemical mechanical polishing CMP process and etch-back process. In the CMP process, the polishing stops when the pad nitride layer 23B is exposed. After the etch-back process, the upper surfaces of the word lines 33A may be flush with or higher than the upper surfaces of the first active pillars 22. In addition, during the etch-back process, the gate conductive layer 27 may also be etched at the same time. Consequently, the vertical gates 27A are formed. The word lines 33A connect the vertical gates 27A adjacent to each other.

Since the word lines 33A are formed through the damascene process, the word lines 33A can be formed to have a uniform height, and thus, the variation of the sheet resistance (Rs) of the word lines 33A can be maintained within a minimum range.

In particular, since the gate conductive layer 27 is etched simultaneously during the etch-back process for forming the word lines 33A, portions of the gate conductive layer 27 on the upper sidewalls of the first active pillars 22 are easily removed. That is, portions of the gate conductive layer 27 on the upper sidewalls of the active pillars 22 can be cleanly removed during the process of forming the word lines 33A, without separate removal processes. Accordingly, the vertical gates 27A are formed concurrently with formation of the word lines 33A.

Figure 2I:
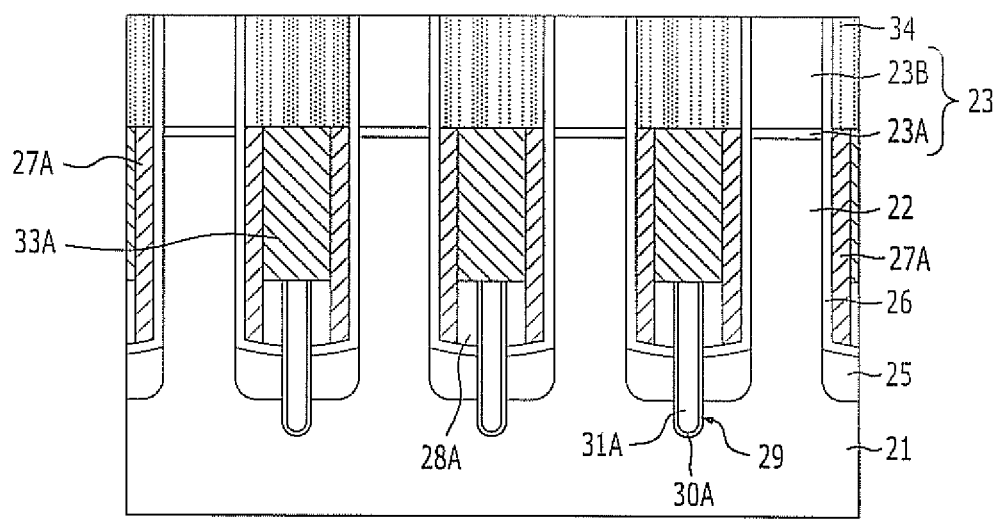
Figure 2J:
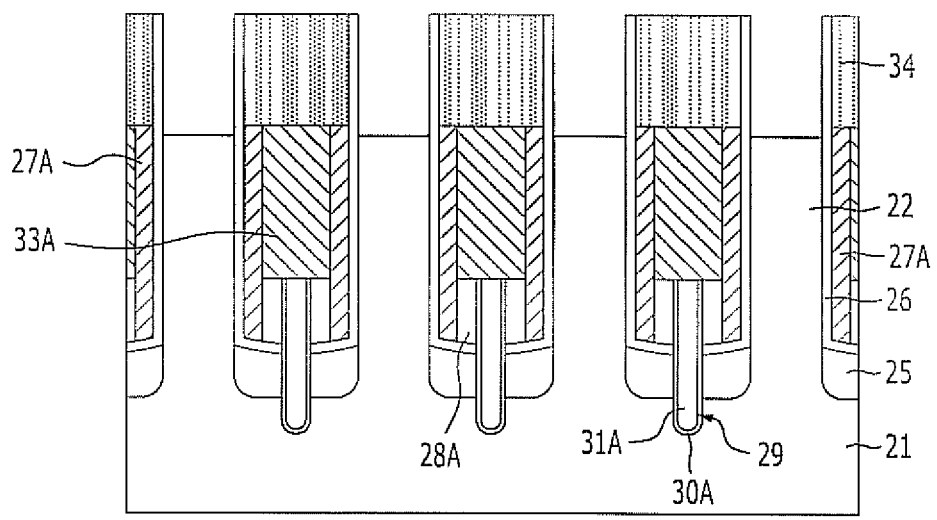

Referring to FIG. 2I, a third inter-layer dielectric layer 34 is deposited and planarized until the surface of the hard mask layer 23 is exposed. The third inter-layer dielectric layer 34 is formed with a thickness of approximately 4,500 Å by using spin-on dielectric (SOD) having excellent flow characteristics. A liner layer (not shown) may be formed prior to the formation of the third inter-layer dielectric layer. The liner layer may be formed of LPTEOS with a thickness ranging from approximately 100 Å to approximately 400 Å.

Referring to FIG. 23, the hard mask layer 23 is removed. Since the hard mask layer 23 has a stacked structure including the hard mask nitride layer 23B and the hard mask oxide layer 23A, a wet etching process may be applied to remove the hard mask nitride layer 23B and the hard mask oxide layer 23A. The hard mask nitride layer 23B may be removed using a phosphoric acid ($H_3PO_4$) solution, and the hard mask oxide layer 23A may be removed using a solution containing a fluoric acid (e.g., HF).

After the hard mask layer 23 is removed, the surfaces of the first active pillars 22 are exposed.

Figure 2K:
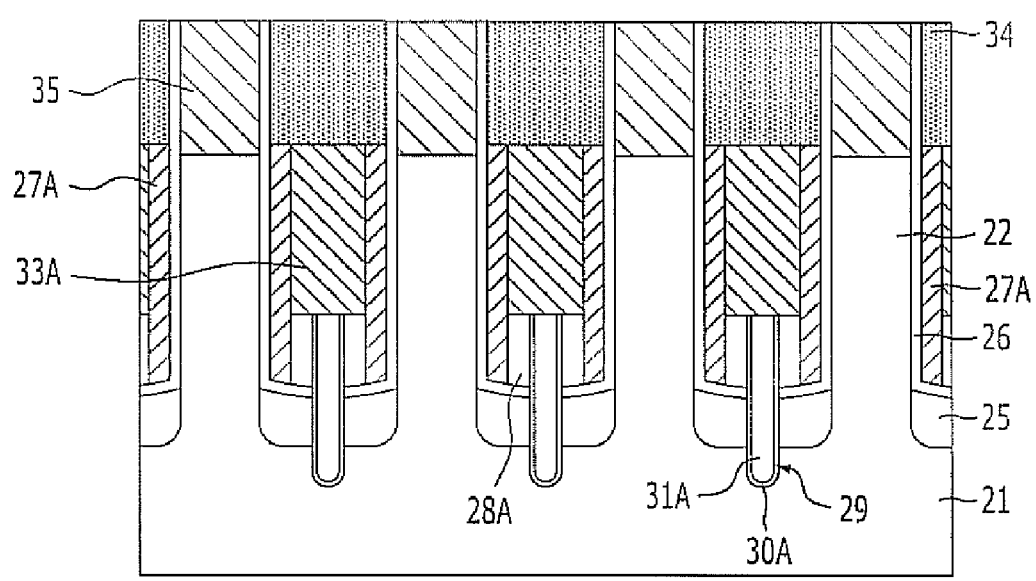

Referring to FIG. 2K, second active pillars 35 are formed on the first active pillars 22 by using an epitaxial growth process. The second active pillars 35 may include a silicon epitaxial layer.

The second active pillars 35 serve as the source/drain regions of the vertical transistors or storage node junctions. Instead of forming all active pillars simultaneously, the active pillars 22 serving as the channel regions are first formed and the second active pillars 35 serving as the source/drain regions are then formed in a subsequent process. A selective epitaxial growth (SEG) process refers to a process which can grow silicon in a region where silicon is exposed, without growing silicon on an oxide layer or a nitride layer. The SEG process can cleanly form the second active pillars 35, which serve as the storage node junctions, with a thickness ranging from approximately 500 Å to approximately 800 Å.

The SEG process for forming the second active pillars 35 uses DCS, $SiH_2Cl_2$, and HCl as an etching gas. Prior to the deposition process, a natural oxide layer is removed from the region where the first active pillars 22 are exposed by a hydrogen baking process, in order to cleanly grow the second active pillars 35 without defects. The hydrogen baking process is performed at a high temperature ranging from approximately 800° C. to approximately 1,000° C. Since the SEG process is also performed at a high temperature ranging from approximately 700° C. to approximately 1,000° C., a capping layer may be formed in advance in order to prevent oxidation of tungsten used to form the word lines 33A. The capping layer may be formed before the third inter-layer dielectric layer 34 is formed, and the capping layer may be formed of nitride by a low pressure chemical vapor deposition (LPCVD) process. The capping layer is formed to have a thickness ranging from approximately 100 Å to approximately 150 Å. During the deposition of the nitride layer through the LPCVD process, dichlorosilane (DCS) gas and $NH_3$ gas are used.

In accordance with exemplary embodiments of the present invention, the first and second active pillars are formed separately, and the vertical gates are formed after the first active pillars are formed. This method ensures that portions of the gate conductive layer on the upper sidewalls of the active pillars are removed.

In addition, the channel length of the vertical gates can be adjusted by etching the first active pillars.

Furthermore, vertical gates having a tail shape are prevented and characteristics of the vertical gates are improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
  forming a plurality of first active pillars by etching a substrate using a hard mask layer as an etching barrier;

forming a gate conductive layer surrounding sidewalls of the first active pillars and the hard mask layer;

forming a word line conductive layer filling gaps defined by the gate conductive layer;

forming word lines and vertical gates by simultaneously removing portions of the word line conductive layer and the gate conductive layer on the sidewalls of the hard mask layer;

forming an inter-layer dielectric layer filling gaps formed by removing the word line conductive layer and the gate conductive layer;

exposing surfaces of the first active pillars by removing the hard mask layer after the forming of the word lines and vertical gates; and growing second active pillars over the first active pillars.

2. The method of claim 1, wherein the second active pillars are formed using a selective epitaxial growth (SEG) process.

3. The method of claim 1, wherein the second active pillars comprise a silicon epitaxial layer which is grown using a selective epitaxial growth (SEG) process.

4. The method of claim 3, wherein the silicon epitaxial layer is formed using DCS and HCl gases.

5. The method of claim 3, further comprising performing a hydrogen baking process on the surfaces of the first active pillars before the SEG process.

6. The method of claim 1, wherein the hard mask layer is formed by sequentially stacking a hard mask oxide layer and a hard mask nitride layer.

7. The method of claim 1, wherein the hard mask layer is removed by a wet etching process.

8. The method of claim 1, further comprising, before the forming of the word line conductive layer filling the gaps defined by the gate conductive layer:

forming buried bit lines inside the substrate through an impurity ion implantation process;

forming trenches separating the buried bit lines from one another; and forming a separation layer filling the trenches.

9. The method of claim 8, wherein the separation layer is formed by sequentially forming a liner layer and a spin-on dielectric layer.

10. The method of claim 9, wherein the liner layer is formed of a low pressure chemical vapor deposition (CVD) tetra ethyl ortho silicate (LPTEOS) having a thickness ranging from approximately 100 Å to approximately 400 Å.

11. The method of claim 1, wherein the forming of the word lines and the vertical gates comprises:

planarizing the word line conductive layer to expose the hard mask layer; and etching the planarized word line conductive layer and the gate conductive layer through an etch-back process.

12. The method of claim 1, wherein the word line conductive layer is formed by using a titanium nitride layer or a tungsten layer solely or by stacking a titanium nitride layer and a tungsten layer.

13. The method of claim 1, further comprising forming a capping layer protecting the word lines before the forming of the inter-layer dielectric layer.

14. The method of claim 13, wherein the capping layer is formed using a nitride layer through a low pressure chemical vapor deposition (LPCVD) process.

15. The method of claim 1, wherein the forming of the inter-layer dielectric layer comprises:

forming the inter-layer dielectric layer over the substrate including the word lines; and planarizing the inter-layer dielectric layer to expose an upper surface of the hard mask layer.

* * * * *